(12) United States Patent
LeCroy et al.

(10) Patent No.: US 6,657,437 B1
(45) Date of Patent: Dec. 2, 2003

(54) METHOD AND SYSTEM FOR PERFORMING TIME DOMAIN REFLECTOMETRY CONTEMPORANEOUSLY WITH RECURRENT TRANSMISSIONS ON COMPUTER NETWORK

(75) Inventors: Dorian LeCroy, Manhattan, NY (US); Neil Judell, Andover, MA (US); William M. Richardson, Bolton, MA (US)

(73) Assignee: Vigilant Networks LLC, Hampton, NH (US)

( * ) Notice: Subject to any disclaimer, the term of this patent is extended or adjusted under 35 U.S.C. 154(b) by 0 days.

(21) Appl. No.: 09/440,293

(22) Filed: Nov. 15, 1999

Related U.S. Application Data

(60) Provisional application No. 60/157,424, filed on Oct. 4, 1999.

(51) Int. Cl.[7] .............................................. G01R 31/11
(52) U.S. Cl. ..................................... 324/534; 324/557
(58) Field of Search ................................ 324/527, 533, 324/534, 557; 370/320; 702/79; 209/224

(56) References Cited

U.S. PATENT DOCUMENTS

| | | | |
|---|---|---|---|
| 4,890,278 A | 12/1989 | Felker et al. | |
| 5,198,805 A | * 3/1993 | Whiteside et al. | .......... 370/248 |
| 5,430,665 A | 7/1995 | Jin et al. | |
| 6,016,464 A | * 1/2000 | Richardson | ................... 702/79 |
| 6,532,215 B1 | * 3/2003 | Muntz | ........................ 370/242 |

FOREIGN PATENT DOCUMENTS

| | | |
|---|---|---|
| EP | 0 691 546 A2 | 1/1996 |
| EP | 0 768 537 A1 | 4/1997 |
| WO | WO 97/27685 | 7/1997 |
| WO | WO 00/39594 | 7/2000 |

OTHER PUBLICATIONS

*Troubleshooting keeps LANs up and running*—Networking Management, v9, n1, p54(4) Jan. 1991.
*LAN Testers Get a Grip on Internetworks: Net managers on the go can get some heavy help from the latest in lightweight testers*—Data Communications, Sep., 1993; p. 95; vol. 22, No. 12.
*Effect of Noise and Bandwidth on Homomorphic Deconvolution*—Document No. XP–002160360, 1990.
*Direct Deconvolution Signal in Time Domain Reflectometry*—Document No. XP–002160280, 1995.

* cited by examiner

*Primary Examiner*—Walter E. Snow
*Assistant Examiner*—Walter Benson
(74) *Attorney, Agent, or Firm*—Rader, Fishman & Grauer PLLC

(57) ABSTRACT

A method for performing time domain reflectometry contemporaneously with recurrent transmissions, such as idle transmissions, on a computer network, such as a 100 BASE T protocol network is disclosed. This method comprises detecting the recurrent transmissions and then storing representations of those transmissions. A probe signal, such as a TDR signal, is then generated onto the computer network during the recurrent transmissions. A response of the network to the probe signal combined with the recurrent transmissions is then detected. The signal transmission characteristics of the network are then analyzable based on the response to the probe signal using the stored representations of the recurrent transmissions, using deconvolution, for example.

11 Claims, 9 Drawing Sheets

2. TOP LEVEL DESCRIPTION

METHOD AND SYSTEM FOR PERFORMING TIME DOMAIN REFLECTOMETRY CONTEMPORANEOUSLY WITH RECURRENT TRANSMISSIONS ON COMPUTER NETWORK

RELATED APPLICATION

This application claims the benefit of U.S. Provisional Application No. 60/157,424, filed Oct. 4, 1999, the entire teachings of which are incorporated herein by reference.

BACKGROUND OF THE INVENTION

The integrity of a computer network's physical layer is critical to its proper operation. While much attention is directed to the operation of the computer-nodes and the network communications devices, e.g., hubs and switches, the relevance assumes proper behavior at the physical layer. For example, in ubiquitous 10Base2, 5, T, and 100BaseT networks, a number of physical layer problems can lead to improper operation. Damage to the cabling can create impedance discontinuities in the conductors, which cause signal reflections. This can impair the proper signal transmission and decoding by the nodes or network communication devices. Further, length of the links can undermine the shared usage of the transmission media. Some protocol specifications, such as the inter-frame gap, are defined based upon the time needed for a given communication event to propagate throughout the entire communication network.

Time domain reflectometry (TDR) techniques have been used to analyze and validate computer networks at the physical layer. The basic process involves generating a predetermined, TDR, signal, such as an impulse or step function, on the conductors of the computer network. At the point of injection, a signal analysis device, such as a digital sampling oscilloscope, is used to monitor the computer network conductors for reflections induced by the TDR signal. These reflections are induced by impedance discontinuities along the computer network transmission media. The size of the reflected signals are indicative of the size of the impedance discontinuity, and the delay between the generation of the TDR signal and the detection of the reflection is indicative of the distance to the discontinuity based upon the round-trip signal travel time.

Generally, TDR is performed on non-operating networks. For example, when network cabling is newly installed, special terminators are placed at the end of links and the TDR device is attached to the link to inject the TDR signal. This allows the network to be verified at the physical layer, prior to connection of the computer network devices, such as the nodes, and the network communication devices, such as the hubs and/or switches.

Various techniques have been proposed for performing TDR analysis on operating networks. These existing techniques are typically targeted at 10BASE 2,5,T systems. In one proposed technique, the TDR signal is injected onto the link, to which operating computer nodes are attached. Simultaneously, the TDR system listens to determine whether the TDR signal has collided with inter-network device communication event. If such a "collision" has occurred, the TDR device forces a collision condition by driving the voltages on the network in accordance with the network's protocol for declaring a collision. The collision condition is initiated to ensure that the network devices do not attempt to decode the corrupted transmission. Another proposed solution relies on the use of packet-like transmissions. Specifically, the TDR system generates a transmission that would appear to be a valid packet or frame transmission for the network. After the generation of the preamble, and possibly header information, rather than a payload, a TDR signal is transmitted. As a result, this system avoids a collision with other network devices by first asserting control of the communications link.

SUMMARY OF THE INVENTION

A problem with these existing techniques for performing TDR analysis is that they rely on the creation or existence of a silent period on the computer network link. For example, one of the previously described approaches injects the TDR signal and assumes that no communications are taking place on the network link. If communications were in fact taking place, a collision condition is forced. The other approach relies on first capturing the network link with a packet-like transmission and then terminating transmissions for the generation of the TDR signal. These approaches are generally acceptable for 10BASE(x) type network systems, where periods exist when there are no transmissions on the network. This assumption, however, can not be made for 100BASET networks. Even when no data is being exchanged between network devices, an idle, or recurrent, signal is transmitted.

In general, according to one aspect, the invention features a method for performing time domain reflectometry contemporaneously with recurrent transmissions, such as idle transmissions, on a computer network, such as a 100 BASET protocol network.

This method comprises detecting the recurrent transmissions and then storing representations of those transmissions. A probe signal, such as a TDR signal, is then generated onto the computer network during the recurrent transmissions. A response of the network to the probe signal combined with the recurrent transmissions is then detected. The signal transmission characteristics of the network are then analyzable based on the response to the probe signal using the stored representations of the recurrent transmissions.

In specific embodiments, the method also comprises detecting a response of the computer network to a probe signal while the computer network is inactive. This is used for providing a base line for future analysis. For example, the response of a network communications device, such as a hub or switch can be assessed and analyzed to facilitate analysis of a node-side of the link. In other aspects of the embodiments, the recurrent transmissions, which are stored, are idle signals from the network. The step of analyzing the signal transmission characteristics of the networks comprises removing the contribution of the idle signal to the detected combined response. This can be done using deconvolution.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
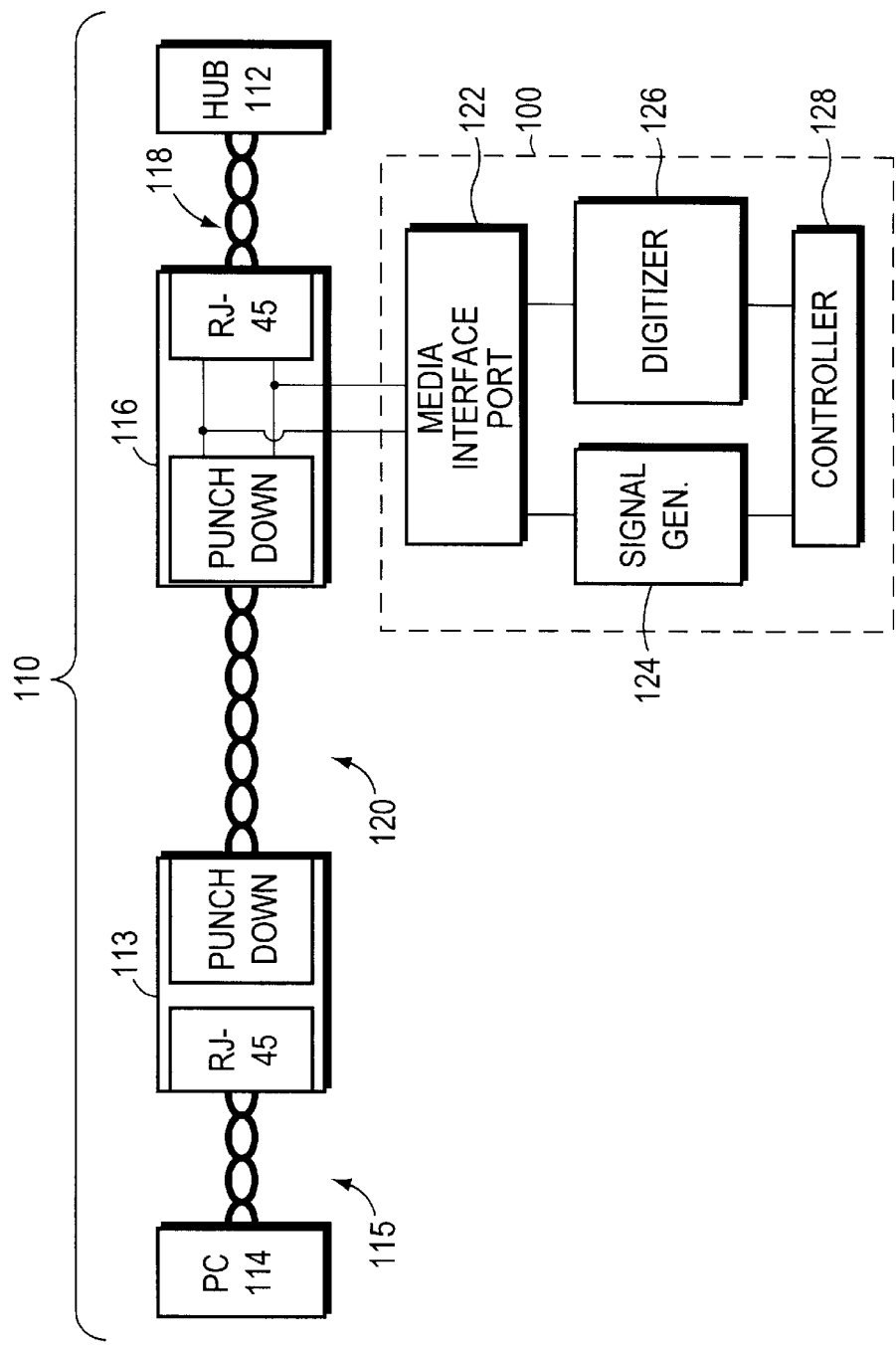
FIG. 1 is a block diagram showing the connection of a physical layer analysis system of the present invention to a computer network at a network patch panel.

FIG. 1 illustrates the connection of the physical layer analysis system 100 to a computer network link 110. Specifically, the link 110 comprises a computer network communications device, which maintains the link 110. In the illustrated embodiment, this device is a hub 112. Alternatively, in other implementations, it could be an independent local area network, having individual collision domain, that is maintained by a switch, for example.

As is typical in most computer network configurations, the computer communications device 112 is connected to the node 114 via a patch panel 116. commonly a patch cable 118 connects the hub 112 to the panel 116, one cable for each link maintained by the hub. The computer nodes 114 are connected to wall boxes 113 via patch cables 115. Horizontal cables 120 originate at the wall boxes 113 and terminate at the patch panel 116. The patch panel supports the electrical connection between the separate patch cables 118 and the conductors of the horizontal cables 120 for each link.

The inventive analysis system 100 comprises a media interface unit 122, which connects a signal generator 124 and digitizer 126 to the link 110 at the patch panel 116. The signal generator 124 is used to generate the TDR signal, which is a step function in the preferred embodiment. The digitizer 126 is used to monitor the voltage on the link as a function of time to detect inter-network device communications and after TDR signal generation to measure the response of the link 110 to the TDR signal.

In the preferred embodiment, the digitizer is a storage oscilloscope-type system having a long memory, which is filled on each acquisition, samples being separated in time by some fixed delay such as 1 nanosecond (ns). The controller 128 synchronizes the operation of the signal generator 124 and digitizer 126 and most importantly, analyzes the data captured by the digitizer to perform the physical layer analysis of the link 110.

In alternative implementations, rather than the use of a special patch panel that supports the physical layer access to the network, the media interface unit is connected into the link using RJ-45 jacks and patch cables.

Figure 2:
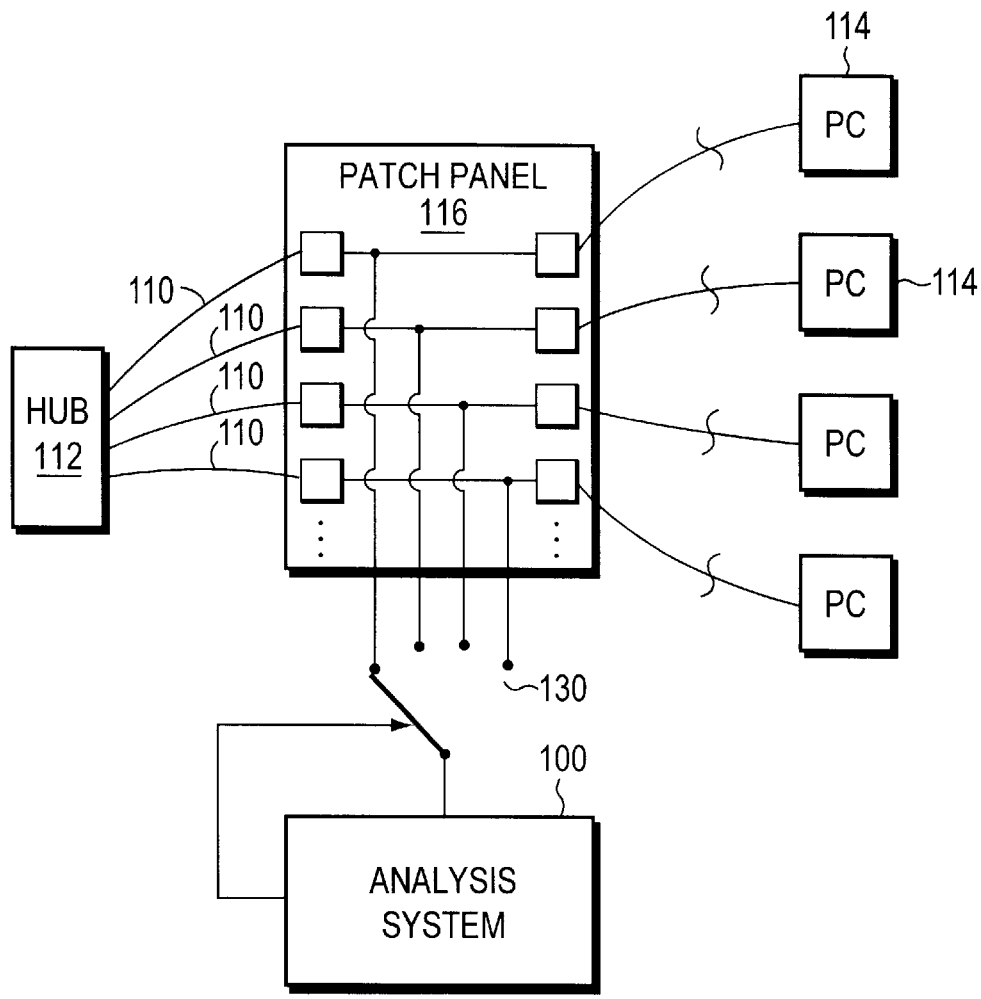
FIG. 2 is a schematic diagram showing the connection of the analysis system in a star topology network.

As shown in FIG. 2, in one implementation, the analysis system 100 accesses multiple, or all, the links 110 serviced by a given network communication device 112 via the patch panel 116. This multi-link monitoring capability is provided by a switching unit 130 between the system 100 and the patch panel, in the illustrated implementation. The switching unit is preferably controlled by the analysis system 100 to enable automated scanning of the multiple links with fewer, or only single or dual, digitizers 126 and signal generators 124.

Figure 3:
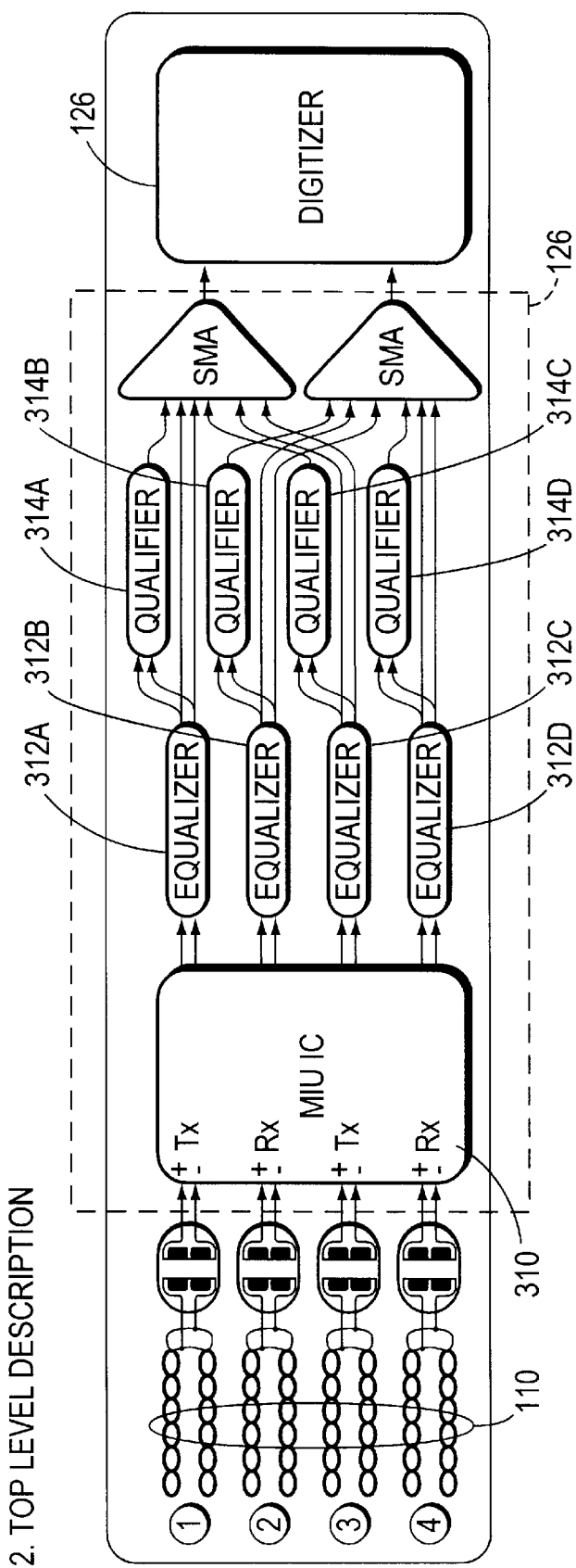
FIG. 3 is a block diagram illustrating the connections between the digitizer and a single link 110 according to the preferred embodiment.

FIG. 3 shows the details of the media interface unit 126 and how the connections are provided between the digitizer 126 and the link 110. Specifically, in the typical CAT-5 wiring scheme having four twisted pair wires in each link-cable, a connection is made to each twisted pair 1-4.

In the 100 BASET protocol, the pairs are designated either Tx or Rx. Specifically, an MIU IC 310 is inductively coupled to each of the four pairs in the cabling of the link 110. The MIU IC 310 ensures a high input impedance, from the perspective of the four twisted pairs of the link 110 to ensure that there is minimal impact on the signal transmission characteristics of the computer network by the physical layer analysis system 100.

The MIU IC 310 provides the signals on each one of the four twisted pairs to separate equalizers 312A–312D. These equalizers restore the transmitted signals appearing on the link to what they were before they went through the cable and media interface unit IC 310. Specifically, these hardware equalizers add gain to those frequencies attenuated by the cable to ensure that they can be later sampled with sufficient signal to noise. Additional compensation can be performed, however, in software.

In the preferred embodiment, the hardware equalizers 312 comprise one or more filters with adjustable gain. These filters selectively amplify signal bands of the signals from the MIU IC for each of the twisted pairs. Preferably, the gain is adjustable in order to accommodate various cable lengths and cable types. The gain parameters are preferably set by the controller 128. Additionally, the equalizers preferably have a bi-pass path which allows the signal to be transmitted through the equalizer without any compensation.

The output from the equalizers 312A–312D for each of the twisted pairs Tx, Rx is passed directly to two selectors SMA. The twisted pairs are interleaved between the two selectors SMA so that any combination of two twisted pairs on the link 110 can be selected on the two channels of the digitizer 126.

The output from the equalizers 312A–312D are also passed separately to four qualifiers 314A–314D. The qualifiers function to distinguish idle patterns on each twisted pair of the link from signals which are other than idle patterns, such as data signals.

Figure 4:
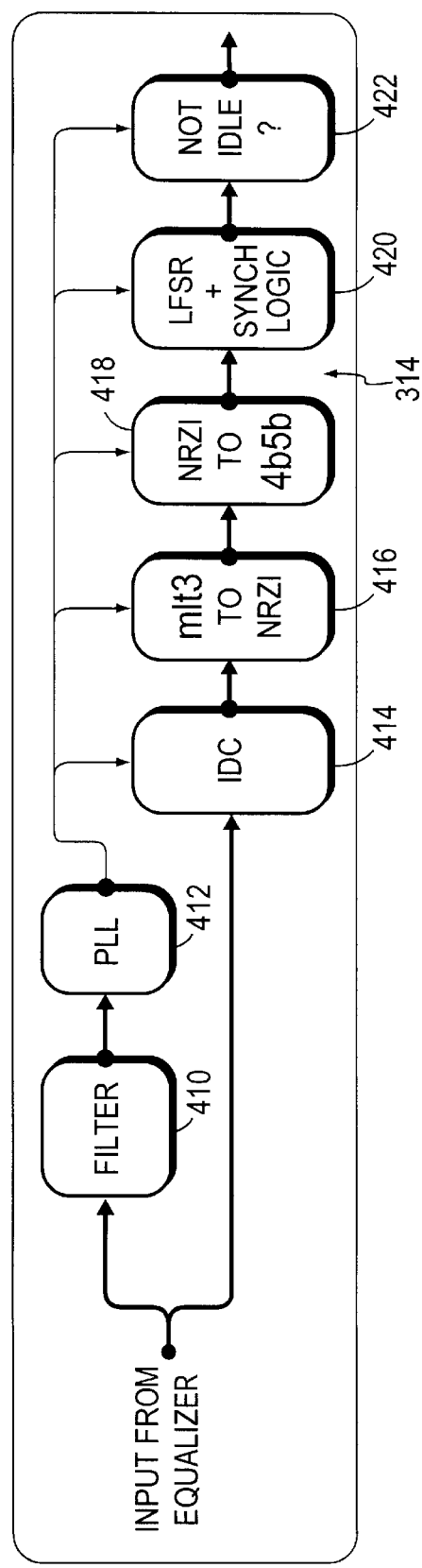
FIG. 4 is a block diagram showing the components of each one of the qualifiers, according to the invention.

FIG. 4 shows the components of the qualifiers 314A–314D. Specifically, filter 410 is responsible for reducing phase error generated by noise and base line wander. In most implementations, a band-pass filter provides useful operation here. The phase locked loop (PLL) 412 is required, because according to the 100 BASET protocol, the transmitted signal can remain in the same state over many clock cycles. This means data can not be decoded without a clock. Further, the PLL must remain locked in the absence of data transmissions. This is accomplished by making adjustment in the voltage controlled oscillator control voltage of the PLL when data edges occur rather than every edge of the clock reference.

The output of the PLL 412 is provided to an interval difference comparitor (IDC) 414. The IDC performs the first phase of data recovery. It takes an average voltage over successive time intervals and compares the difference against a threshold. In effect, it is a noise filter, digital high pass filter, and correlation filter. This results in increased noise tolerance and baseline wander immunity.

The output of the IDC 414 is received by an MLT3 to NRZI converter 416. This converter essentially takes the absolute value of the MLT3 waveform. Specifically, it converts the pseudo-ternary MLT3 code to the non-return to zero version. The NRZI to 4b5b converter 418 substitutes 'ones' for transitions and 'zeros' for where there is no transition. The LFSR +sync logic is a linear feedback shift register with XOR feedback at the ninth and eleventh bits, which is a source of the scrambling in the 100 BASET protocol. Data gets XOR'd with pseudo-random output of the LFRS before being transmitted. Upon reception, a synchronized LFSR is used to descramble. Synchronization is accomplished by taking the inverse of the received data and outputting it into the LFSR until the LFSR XOR'd with the received data is all '1's for at least a certain run length. Finally, the "non-idle" block 422 represents a state machine. It is in state 1 when the input is in an idle pattern and state 2 when the input is not an idle pattern. State transitions occur when the last ten bits are all '1's—go to state one, last bit was '0—goes to state 2. Preferably, it is more sensitive than most carrier sense state machines, requiring only a single zero instead of two, because this allows it to catch transient interference.

Figures 5A, 5B:
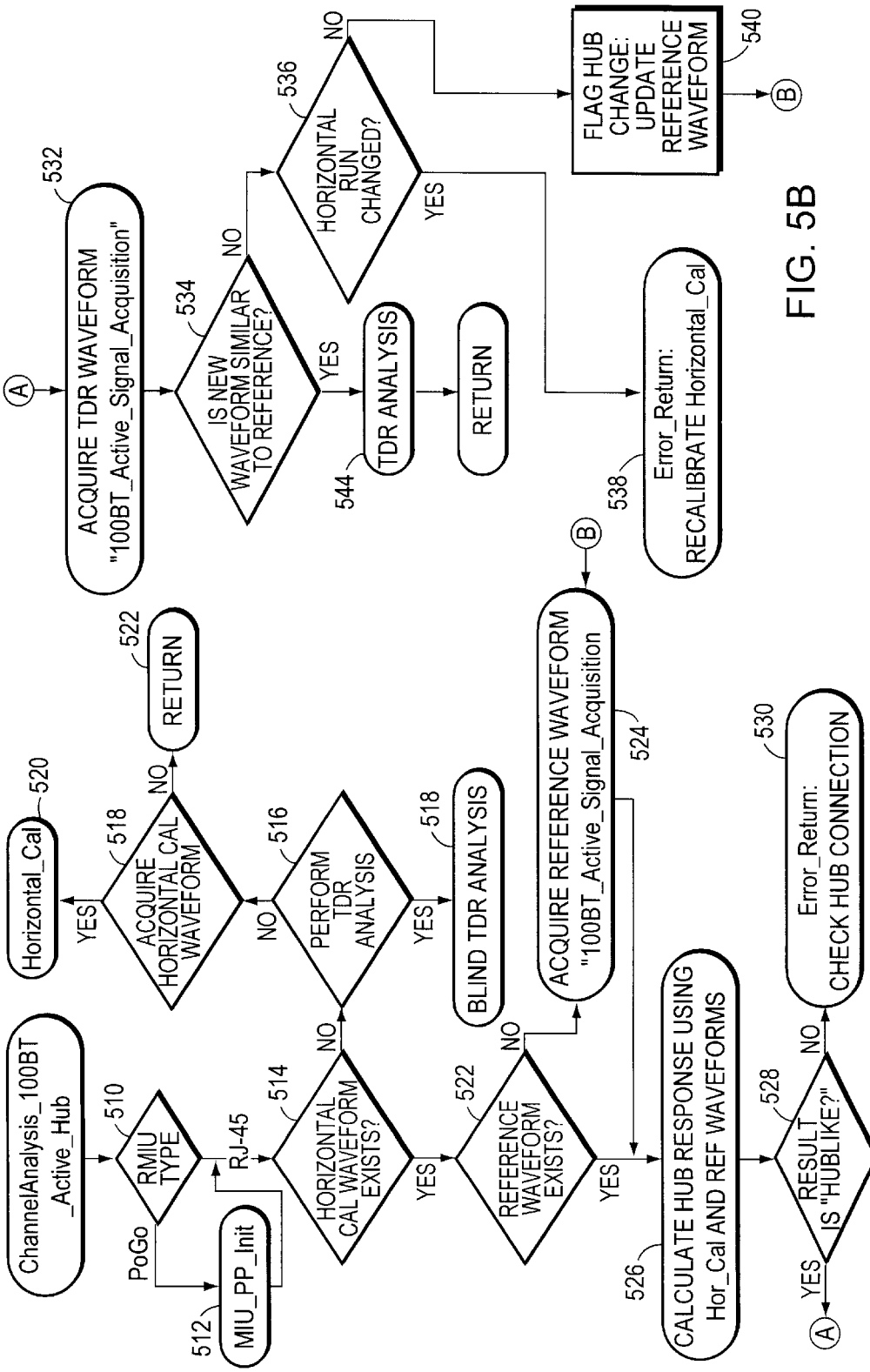
FIGS. 5A and 5B are flow diagrams showing the overall operation of the physical layer analysis system 100 on a 100 BASET network.

FIGS. 5A and 5B are a flow diagram illustrating the overall operation of the physical layer analysis system 100 for 100 BASET network links.

First, in the illustrated implementation, the controller 128 determines what type of media interface unit connects the system 100 to the computer network. Presently, there are two implementations. One uses conventional RJ 45 jacks with patch cables. Another implementation uses special patch panels with an MIU having pogo pins that accesses a physical layer via signal paths on a face panel of the patch panel. Different analog corrections are required independence upon which connection mode is used. Specifically, in step 510, the type of media interface 122 is interrogated for initialization under control of the controller 128, in step 512.

Next in step 514, the controller 128 determines whether or not a horizontal calibration waveform exists. The waveform corresponds to the response of the link 110 to the TDR signal when the link is non-operational, i.e., no idle waveform or data-bearing waveforms are being transmitted by network devices.

If it is determined that no horizontal calibration waveform exists in step 514, it is then questioned whether TDR analysis can be performed currently in step 516. If it can be performed, a "blind" TDR analysis is performed in step 518. However, if TDR analysis can not be performed as determined in step 516, it is then questioned whether a horizontal calibration waveform for the link can be acquired in step 518. If one is available, it is stored to the controller 128 in 520. If a horizontal waveform can not be acquired, flow returns in step 522.

Figure 6:
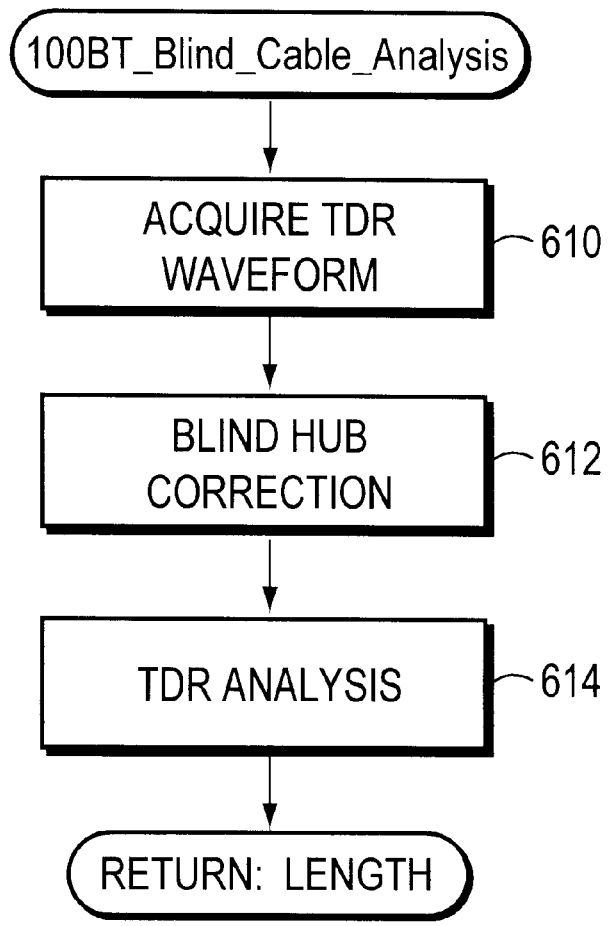
FIG. 6 is a flow diagram illustrating the steps associated with the blind TDR analysis.

FIG. 6 shows the process performed by the system controller to acquire the horizontal calibration waveform using the blind TDR analysis in step 518. Specifically, in step 610, the signal generator 124 is triggered to generate a TDR signal onto the inactive link 110 and the response of the link 110 is detected by the digitizer 126. The controller 128 first forms a blind hub correction. This removes the response of the hub from the link's total response. Typically, the hub response is very inductive. It is also a relatively short lived when compared with the time required for the TDR signal to traverse the entire length of the link. Finally, in step 614, the response of the link, excluding the hub, is analyzed. Generally, these are the portions of the link which are most susceptible to undetected damage. Further, this analysis yields the length of the link.

Returning to FIG. 5A, it is interrogated whether or not a reference waveform exists in step 522. The reference waveform is the digital sampling of the analog characteristics of an idle waveform on the link 110. Specifically, the digitizer 126 samples an idle waveform which is generated by the hub 112 and node 114 under the control of the controller 128 and the idle detector state machine 422. If it is determined that a waveform does not already exist in step 522, step 524 is performed in which the waveform is actively acquired.

Figure 7B:
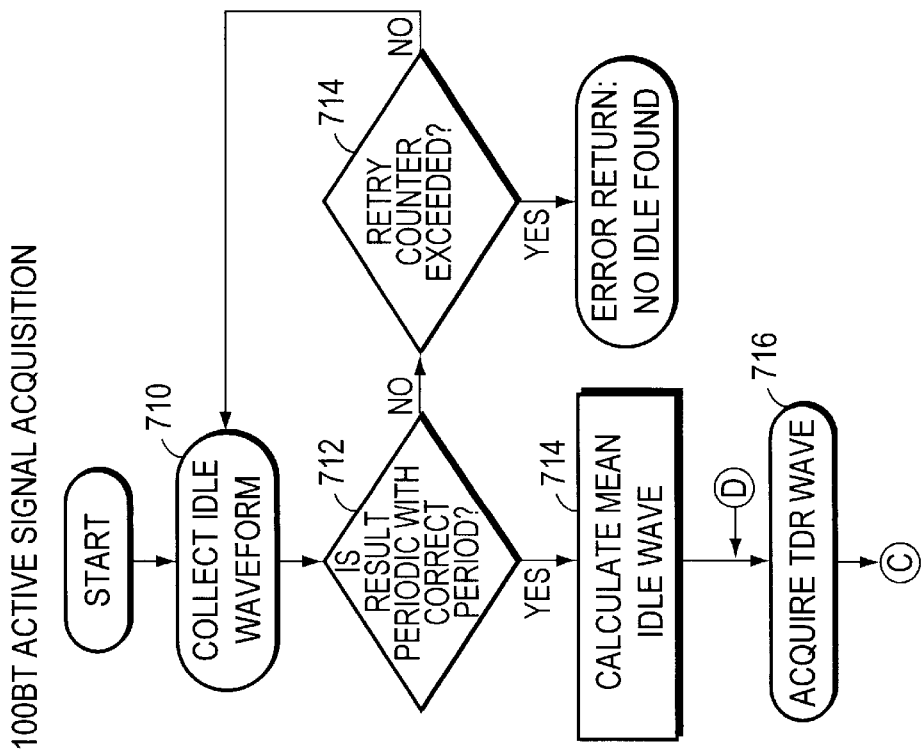
FIGS. 7A and 7B are flow diagrams illustrating the 100 BASET active signal acquisition steps.
Figure 7A:
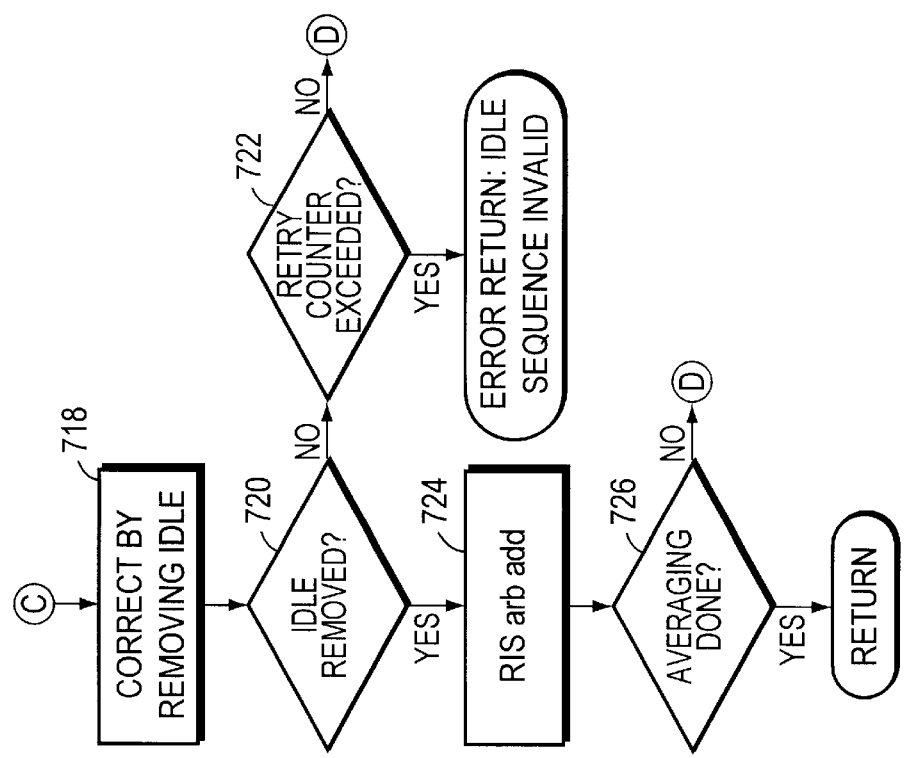

FIGS. 7A and 7B show the steps associated with the active signal acquisition. First, in step 710, an idle waveform is collected or sampled on the link 110. In step 712, the controller 128 analyzes the data from the idle signal sampling to determine if it has a correct period. If the period is not correct, additional idle waveforms are recollected in step 710 unless the number of retries is exceeded as determined in step 714.

Once the correct idle waveform has been sampled, the mean of the idle wave is calculated in step 714.

Next is step 716, the controller 128 controls the signal generator 124 to launch the TDR signal onto the link 110. The digitizer 126 then samples the response to the TDR wave. This response is the response of the link to the combination of the idle waveform and the TDR signal.

As shown in FIG. 7B, in step 718, the waveform acquired in step 716 is corrected by removing the idle waveform. This is accomplished by time-aligning the idle waveform with the combined TDR/idle waveform acquired in step 716 and then deconvolving the idle waveform collected in step 710 from the TDR waveform acquired in step 716.

Step 720 determines whether or not the idle waveform has been successfully removed from the combined TDR waveform. Specifically, it is determined whether or not there is any digital, idle wave characteristics in the result of the deconvolution performed in step 718. If the removal is unsuccessful, a new TDR waveform is acquired in step 716.

In step 722, it is determined whether or not too many attempts have been made to remove the idle waveform from the combined TDR waveform and flow is stopped if the counter has been exceeded.

If the idle waveform is determined to have been successfully removed in step 720, an averaging fix up is performed in step 724. Specifically, the calculated mean of the idle waveform is used to adjust the TDR response of the link 110. The success of this averaging is accessed in step 726 and a new TDR waveform acquired if it is unsuccessful. In contrast, if it is successful, the active signal acquisition returns a reference waveform as a result.

Returning to FIG. 5A, the hub response is calculated in step 526 using the horizontal calibration waveform, generated by the blind TDR analysis in step 518 and the reference waveform generated in the active signal acquisition of step 524.

Figure 8:
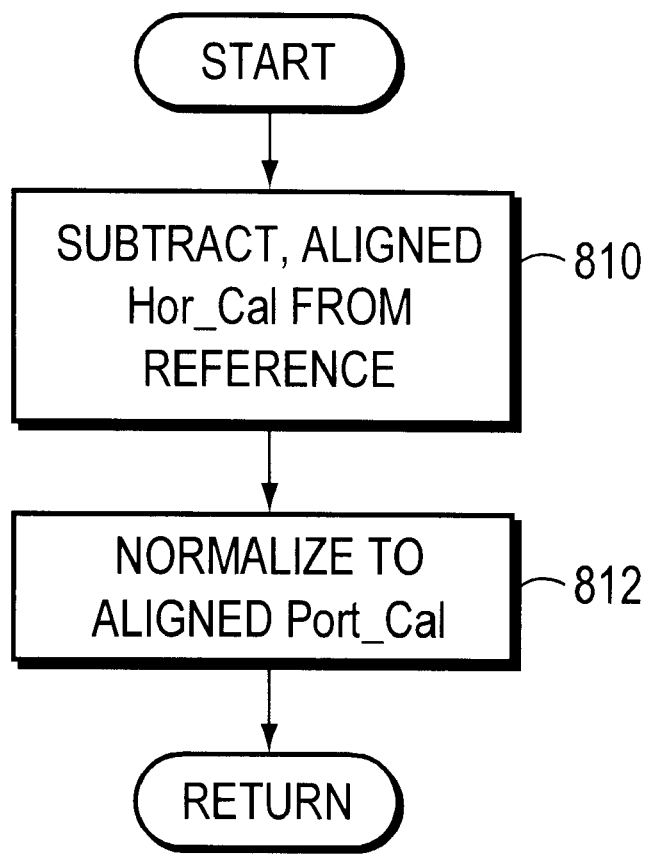
FIG. 8 is a flow diagram showing the steps for identifying the hub response according to the present invention.

FIG. 8 is a flow diagram showing the steps associated with identifying the hub response using the reference and horizontal calibration waveforms. Specifically, in step 810, the horizontal calibration waveform is time aligned to the reference waveform and then they are subtracted from each other. Then, in step 812, the result of the subtraction of the horizontal calibration and the reference waveforms is normalized with respect to a port calibration waveform. The port calibration waveform is generated during initial setup with the digitizer generating the TDR signal into resistors that correspond to the characteristic impedance of the network link. This process allows the system to remove any effect that corresponds to the fact that the TDR signal is not a perfect step or impulse function due to limitations in the signal generator 124.

Returning to FIG. 5A, in step 528, the controller 128 determines whether or not the response is "hub-like". In short, it is determined from the response whether or not the hub is connected and operational. Typically, a connected, operational hub has a very inductive response. If the response does not appear "hub-like", an error is returned in step 530.

FIG. 5B shows the remainder of the steps performed in the channel analysis. The processing thus far establishes a baseline for identifying any subsequent changes in the link 110. Specifically, at a later date, the step of active signal acquisition is again performed in step 532. This process corresponds to the active signal acquisition described in connection with FIGS. 7A and 7B.

Then, in step 534, the new waveform generated in step 532 is compared against the reference waveform which was generated in step 524.

Figure 9:
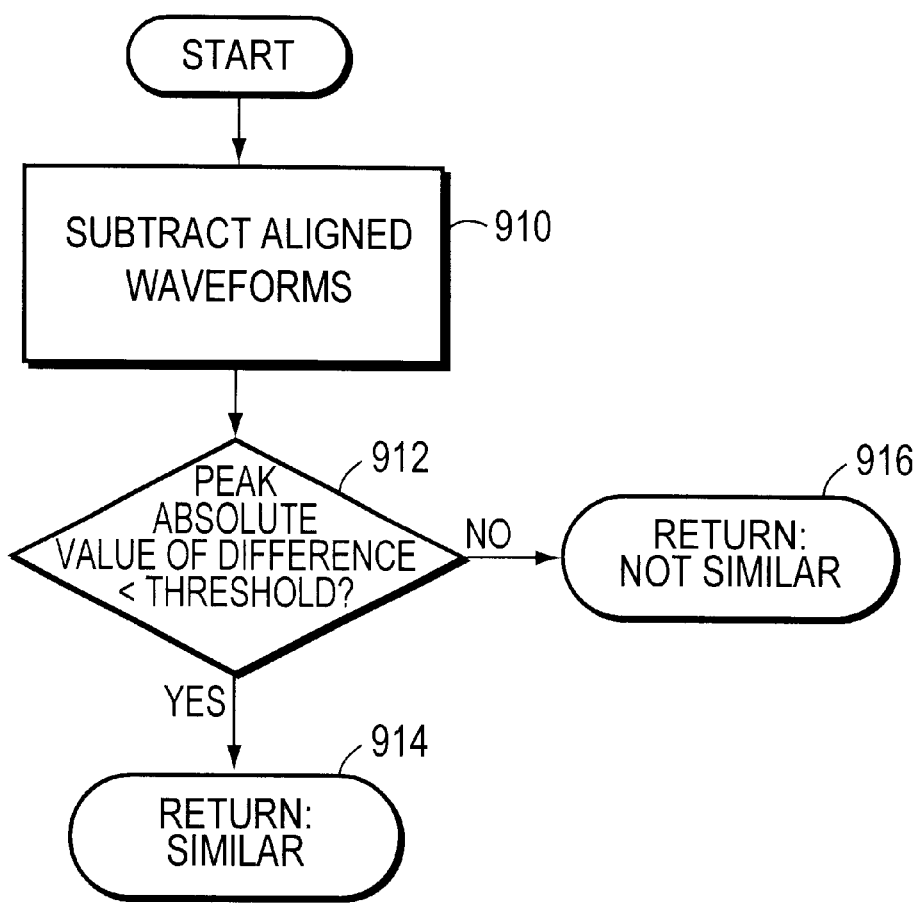
FIG. 9 is a flow diagram showing the waveform similarity test according to the present invention.

FIG. 9 shows the waveform similarity test performed between the reference waveform and the new waveform generated in step 532. Specifically, the reference and the new waveform are time aligned and then subtracted from each other in step 910. In step 912, the absolute value of the sample-to-sample differences are subtracted. This is then compared to a threshold. If it is less than a threshold, the reference and the new waveforms are declared similar in step 914, otherwise, they are declared not similar in step 916.

Returning to FIG. 5B, if the waveforms are declared not similar in step 534, it is determined whether or not the horizontal run of the link 110 has changed in step 536. If the horizontal run has changed, a recalibration is necessary with the acquisition of a new horizontal calibration waveform in step 538. In contrast, if the horizontal run is determined to not have been changed, a new reference waveform must be acquired and due to a presumed change in the hub, this is a flagged to occur in step 540.

In step 536, a change in the horizontal run is determined by detecting the location of a termination of the link. This process is described in detail in the application entitle "Method and System for Characterizing Terminations in a Local Area Network", by William M. Richardson, U.S. application Ser. No. 08/890,486, filed on Jul. 9, 1997, which is incorporated herein by this reference.

Assuming that the new waveform is similar to the reference waveform as determined in step 534, TDR analysis can then be performed in step 544. Specifically, such link parameters as cable resistivity, crosstalk, cable impedance, impedance verses frequency, return loss verses frequency, cable attenuation verses frequency, cable length, impedance verses distance, resistance verses distance, are determined. This analysis is described in "Computer Network Physical-Layer Analysis Method and System", by Richardson, et al., U.S. Provisional Application 60/114,303, filed on 60/114,303, which is incorporated herein by this reference.

While this invention has been particularly shown and described with references to preferred embodiments thereof, it will be understood by those skilled in the art that various changes in form and details may be made therein without departing from the spirit and scope of the invention.

What is claimed is:

1. A method for performing time domain reflectometry contemporaneously with recurrent transmissions on a computer network, the method comprising:

detecting the recurrent transmissions;

storing representations of the recurrent transmissions;

generating a probe signal on the computer network during the recurrent transmissions;

detecting a response of the network to the probe signal combined with the recurrent transmissions; and analyzing signal transmission characteristics of the network based on the response to the probe signal using the stored representations of the recurrent transmissions.

2. A method as described in claim 1, further comprising detecting a response of the computer network to a probe signal while the computer network is inactive.

3. A method as described in claim 2, wherein the computer network comprises a link on which the time domain reflectometry is being performed, and the step of detecting the response of the computer network to a probe signal while the computer network is inactive comprises detecting a response of a network device maintaining the link.

4. A method as described in claim 3, wherein the network device is a hub.

5. A method as described in claim 1, wherein the step of storing representations of the recurrent transmissions comprises storing representations of the recurrent transmissions based on transmissions detected prior to the generation of the probe signal.

6. A method as described in claim 1, wherein the step of storing representations of the recurrent transmissions comprises storing representations of the recurrent transmissions based on transmissions detected after to the generation of the probe signal.

7. A method as described in claim 1, wherein the computer network is a continuous transmission network, and the steps of detecting and storing the recurrent transmissions comprises detecting and storing an idle signal.

8. A method as described in claim 1, wherein the step of detecting the recurrent transmissions comprises performing hardware equalization of the transmissions.

9. A method as described in claim 1, wherein the step of analyzing the signal transmission characteristics of the network comprises removing the contribution of the recurrent transmissions to the detected combined response of the network.

10. A method as described in claim 1, wherein removing the contribution of the recurrent transmissions comprises performing deconvolution.

11. A method as described in claim 1, further comprising multiple links of continuous transmission computer networks and prior to said detecting step, comparing transmission on the links of the computer networks to stored idle signals for the computer networks.

* * * * *